US006764964B2

(12) United States Patent
Hwang et al.

(10) Patent No.: US 6,764,964 B2
(45) Date of Patent: Jul. 20, 2004

(54) METHOD FOR FORMING PATTERNS OF A SEMICONDUCTOR DEVICE

(75) Inventors: Young-sun Hwang, Ichcon-shi (KR); Jae-chang Jung, Seoul-shi (KR); Sung-koo Lee, Seoul-shi (KR); Chcol-kyu Bok, Seoul-shi (KR); Ki-soo Shin, Sungnam-shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/331,527

(22) Filed: Dec. 30, 2002

(65) Prior Publication Data
US 2004/0014322 A1 Jan. 22, 2004

(30) Foreign Application Priority Data
Jul. 22, 2002 (KR) ................... 10-2002-0043038

(51) Int. Cl.[7] .............................................. H01L 21/31
(52) U.S. Cl. ................... 438/781; 438/780; 438/949; 438/952
(58) Field of Search ..................... 438/780, 781, 438/948, 952

(56) References Cited

U.S. PATENT DOCUMENTS

| 5,474,877 | A | 12/1995 | Suzuki ................... 430/325 |
| 6,214,637 | B1 * | 4/2001 | Kim et al. .................. 438/72 |
| 6,329,126 | B1 | 12/2001 | Tanaka et al. ............ 430/331 |
| 6,423,650 | B2 * | 7/2002 | Plat et al. .................. 438/780 |
| 6,479,401 | B1 * | 11/2002 | Linliu et al. ............... 438/763 |

FOREIGN PATENT DOCUMENTS

WO    WO 02/067304 A1    8/2002

\* cited by examiner

*Primary Examiner*—Amir Zarabian
*Assistant Examiner*—Jeff Vockrodt
(74) *Attorney, Agent, or Firm*—Marshall, Gerstein & Borun LLP

(57) ABSTRACT

A method for forming patterns of a semiconductor device is disclosed which inhibits collapse of photoresist patterns in photoresist pattern-forming processes of the semiconductor device by forming micro-bends in an anti-reflective film to increase the contact area between a photoresist and the anti-reflective film and, simultaneously prevents critical dimension (CD) alteration of the photoresist pattern by creating micro-bends and double-laminating of anti-reflective films with different refractive indices and light-absorbencies.

10 Claims, 2 Drawing Sheets

METHOD FOR FORMING PATTERNS OF A SEMICONDUCTOR DEVICE

BACKGROUND

1. Technical Field

Methods for forming patterns of semiconductor devices are disclosed which can inhibit collapse of the patterns during pattern-forming processes by forming micro-bends in the anti-reflective film thereby increasing the contact area between the photoresist and the anti-reflective film and, at the same time, prevent CD critical dimension) alteration of the photoresist pattern having micro-bends and which double-laminate two anti-reflective films with different refractive indices and light-absorbencies.

2. Description of the Related Art

It is known in microfine pattern-forming process among conventional semiconductor production methods that standing waves generated by optical properties of the lower film layer, that is, a substrate of a photoresist film and/or alteration of thickness of a photosensitive film, reflective notching, and/or CD variation of the photoresist pattern derived from diffracted light and reflective light emitted from substrates occurs. Accordingly, it has been proposed to introduce a layer for reducing the reflection onto the substrate between the substrate and the photoresist by employing materials with excellent light-absorbing ability within a range of wavelengths of exposure light sources. Such a protecting layer being is referred to as an anti-reflective film. Anti-reflective films may be generally classified into inorganic and organic based anti-reflective films based on types of materials to be used.

In recent years, the organic anti-reflective films are predominantly used in microfine pattern-forming processes and a number of the organic anti-reflective films have been proposed.

Meanwhile, if the adhesive ability of the photoresist and the organic anti-reflective film is poor, collapse of the photoresist pattern formed on top of the anti-reflective film may occur. Accordingly, two methods to solve this problem have been proposed. One method is to develop organic anti-reflective films to match with particular photoresists selected to form the desired patterns to thereby the adhesiveness between the photoresist and the anti-reflective film. However, development of novel organic anti-reflective films is expensive and requires lengthy research efforts so that such a strategy may not be cost effective.

Another method for enhancing the adhesiveness between photoresists and anti-reflective films has been to increase the surface contact between the photoresist pattern and the anti-reflective film. But, it is well known that increasing the surface contact is also substantially restricted since the contact area is usually determined by the photoresist pattern CD.

Applicants have found that when an etching process is performed on an organic anti-reflective film after coating the organic anti-reflective film, it can form micro-bends (too small to be observed by SEM) which increase the surface contact area between the organic anti-reflective film and the photoresist pattern when forming photoresist patterns on such micro-bends. Then micro-bends also act to inhibit collapse of the photoresist pattern.

However, such a process may induce differences in the thickness in the anti-reflective film caused by the micro-bends and, due to reflected light from such a difference, generates a CD variation of the photoresist pattern.

Hereinafter, the above problem will be described in detail with reference to the accompanying drawings.

FIG. 1 is a graph illustrating the relation between the reflectivity and the thickness of organic anti-reflective film.

As described above, when the etching process for the organic anti-reflective film is conducted to form the micro-bends, such bends generate variation in thickness from about several Å to several tens of Å. In particular, as shown in FIG. 1, the reflectivity at the lower limit is equal to or less than 0.5% below the poor level of the reflectivity to be a problem, which means that reflected of light in an amount of 0.5% or less of total amount of light generated by the light source. While this occurs, for example, 70 Å(=7 nm) of thickness difference, it leads to 2.0% of the reflectivity causing a severe reflection so that CD variation of the photoresist patterns results.

Due to such existing problems as described above, it has been still urgently demanded to find improved method for pattern-forming in semiconductor device which can inhibit collapse of patterns by increasing adhesive ability between photoresist pattern and anti-reflective film and, at the same time, prevent CD uniformity of photoresist patterns from being lowered.

SUMMARY OF THE DISCLOSURE

Accordingly, methods for forming patterns of semiconductor devices are disclosed which can inhibit collapse of photoresist patterns during pattern-forming processes by forming micro-bends in the anti-reflective film to increase the contact area between the photoresist and the anti-reflective film and, at the same time, prevent CD alteration of the photoresist pattern resulting from the micro-bends by double-laminating two anti-reflective films with different refractive indices and light-absorbencies.

Semiconductor devices produced using the above methods for forming photoresist patterns of a semiconductor device.

The disclosed method for forming a photoresist pattern of a semiconductor device comprises (a) applying a first organic anti-reflective coating composition on a surface of a layer to be etched and conducting a baking process to form a first anti-reflective film; (b) onto the upper portion of the first anti-reflective film, applying a second organic anti-reflective coating composition with a different refractive index and light-absorbency from the first composition and conducting a further baking process to form a second anti-reflective film; (c) performing an etching process of the formed anti-reflective films to form micro-bends thereon; and (d) coating the photoresist above the anti-reflective films with micro-bends, exposing the coated anti-reflective films to a light source and then developing the same to form desirable photoresist patterns.

Using the disclosed method, micro-bends are formed on the anti-reflective film suitable to increase contact area between the anti-reflective film and the photoresist patterns by progressing the etching process, resulting in prevention of the photoresist patterns from collapsing; and producing the anti-reflective film by double-coating two kinds of organic anti-reflective coating compositions with different refractive indices and light-absorbencies so that it can minimize reflective light derived from the difference in thickness in the anti-reflective films by interference of the light (that is, destructive interference), thereby preventing CD alteration problem from the reflective light.

An embodiment of the method for forming patterns of a semiconductor device according to the present invention preferably uses a first coating composition having a refractive index ranging from 1.20 to 2.00 and light absorbency ranging from 0.2 to 0.9 of and the second coating composition having a refractive index ranging from 1.20 to 2.00 and light absorbency ranging from 0.00 to 0.50, respectively. Such a range of light absorbency can provide a final anti-reflective film with preferable light-absorbency thereby efficiently removing the reflection of lower film layer, and greatly reduce reflective light generated due to the differences in thickness of the anti-reflective film by means of the formed first and second anti-reflective films with the preferable refractive indices.

Particularly, with respect to a microfine pattern-forming process using 193 nm ArF light source, DARC-20 (commercial trade name, with a refractive index of 1.64 and light-absorbency to 193 nm light of 0.64) is preferably employed as the first anti-reflective coating composition while as the second anti-reflective coating composition, DARC-21 (commercial trade name, with a refractive index of 1.54 and light-absorbency to 193 nm light of 0.38) or DARC-22 (commercial trade name, with a refractive index of 1.49 a light-absorbency to 193 nm light of 0.33) are preferably applied. Since the coating compositions described above show optimal light-absorbencies and refractive indices to 193 nm light, it is expected that employing such compositions can substantially eliminate the reflective light generated due to the difference in thickness of the anti-reflective films by means of light interference, so that the disclosed method can prevent CD alteration of the film caused by the reflective light and, thereby allowing the final obtained anti-reflective film to have an optimum light-absorbency.

Another disclosed method comprises preparing the first and second anti-reflective films with a preferable thicknesses of about 355 Å and 1000 Å, respectively. After preparing each of the anti-reflective films having such a thickness, it is under the etching process to produce micro-bends. As a result, the etched first anti-reflective film has a thickness of about 355 Å while the second film has a thickness of about 1000 Å. Because the interference of light depends on the refractive index and thickness of the respective layer, it is understood that if the first and second films having the above refractive indices maintain those thicknesses. The reflective light generated due to the micro-bends may be minimized by destructive interference of the light so that it maintain uniformity of the photoresist patterns.

In the method for forming patterns of a semiconductor device the present invention, the baking process is preferably conducted at about 150 to about 300□C. for about 1 to about 5 minutes. Under such conditions, acid is generated from a thermal acid generator to form cross-linkage bonds within the anti-reflective film and, thereby producing the desired anti-reflective film which does not dissolve in the solvent of the photoresist.

Moreover, the baking process can be additionally performed before and/or after the exposure process and preferably in the range of 70 to 200° C.

Such a photoresist pattern-forming method can be applied preferably in microfine pattern-forming processes using ArF, KrF, deep-ultraviolet (DUV) including EUV, E-beam, X-ray or ion beam, although they are generally employed in microfine pattern-forming processes using ArF light source.

Still another aspect of the present invention provides a semiconductor device produced using the photoresist pattern-forming method according to the present invention.

BRIEF DESCRIPTION OF DRAWINGS

The above and other aspects of the disclosed techniques will become apparent from the following description of embodiments with reference to the accompanying drawings, wherein.

DETAILED DESCRIPTION OF THE PRESENTLY PREFERRED EMBODIMENTS

COMPARATIVE EXAMPLE 1

Figure 1:
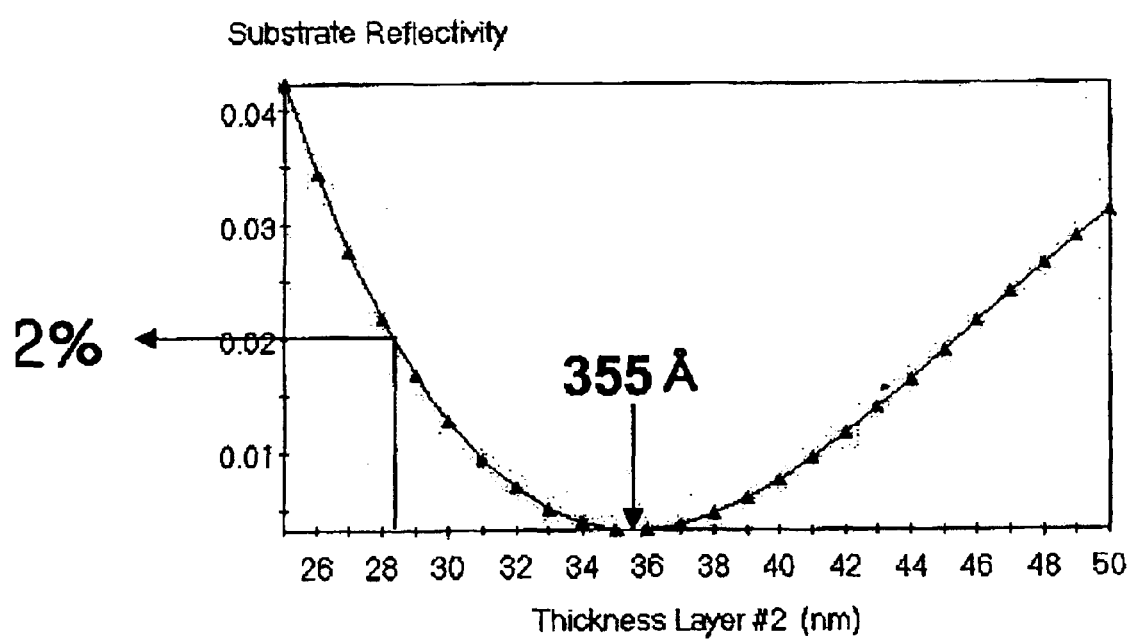
FIG. 1 is a graph illustrating the relation between the reflectivity to thickness of an organic anti-reflective film.

Formation of Photoresist Pattern by Conventionally Known Method

An organic anti-reflective coating composition having a refractive index of 1.64 and light-absorbency of 0.64 at 193 nm light (manufactured by DONG-JIN SEMICHEM corp., which has the trade name of DARC-20 available for a 1355 Å coating) was spin-coated on a silicon wafer, baked at 240° C. for 90 seconds to generate cross-linkage bonds and, thereby, form the intended anti-reflective film with a 1355 Å thickness. The resultant anti-reflective film was subjected to an etching process using an e-MAX etching apparatus (available from AMAT corp.). Such an etching process was performed under the conditions of 50 mT/300W and 150Ar/80$CF_4$/20$O_2$/20CO/20" to produce the anti-reflective film of a thickness of about 355 Å.

The processed anti-reflective film was further subjected to additional baking process at 120° C. for 90 seconds after coating the film with a photoresist available from and manufactured by Clariant Corp., which has the trade name of AX1020P, widely known as a photoresist material. After the baking process, the obtained material was exposed to light by means of an ArF exposure apparatus manufactured by ASML and further baked at 120° C. for 90 seconds. To the exposed wafer, a developing process was performed in 2.38% by weight aqueous TMAH developer solution to obtain a 100 nm L/S pattern. As a result of determining CD at 20 points for the 100 nm pattern, the CD represented a standard deviation of 18.34 nm.

EXAMPLE 1

Formation of Photoresist Pattern by the Present Invention

An organic anti-reflective coating composition having a refractive index of 1.64 and light-absorbency of 0.64 at 193 nm light (manufactured by DONG-JIN SEMICHEM corp., which has the trade name of DARC-20 available for a 355 Å coating) was spin-coated on a silicon wafer, baked at 240° C. for 90 seconds to generate cross-linkage bonds and, thereby forming the intended first anti-reflective film with a 355 Å thickness. Again, onto the coated anti-reflective film, another organic anti-reflective coating composition having a refractive index of 1.54 and light-absorbency of 0.38 at 193 nm light which has the trade name of DARC-21, baked at 240° C. for 90 seconds to generate cross-linkage bonds and, thereby forming the second anti-reflective film with a 1000 Å thickness. The obtained second anti-reflective film was subjected to etching process using e-MAX etching apparatus (available from AMAT corp.). Such an etching process was performed under the condition of 50 mT/300W/150Ar/80$CF_4$/20$O_2$/20CO/20" to produce the resultant anti-reflective film having 455 Å, which substantially represents the sum of 355 Å of the first anti-reflective film and 100 Å of the second anti-reflective film.

The processed anti-reflective film was further subjected to additional baking process at 120° C. for 90 seconds after coating the film with a photoresist available from and manufactured by Clariant corp., which has the trade name AX1020P, widely known as a photoresist material. After the baking process, the obtained material was exposed to light by means of ArF exposure apparatus manufactured by ASML and further baked at 120° C. for 90 seconds. To the exposed wafer, a developing process was performed in 2.38% by weight aqueous TMAH developer solution to obtain 100 nm L/S pattern. As a result of determining CD at 20 points for the 100 nm pattern, the CD represented a standard deviation of 5.82 nm.

Figure 2:
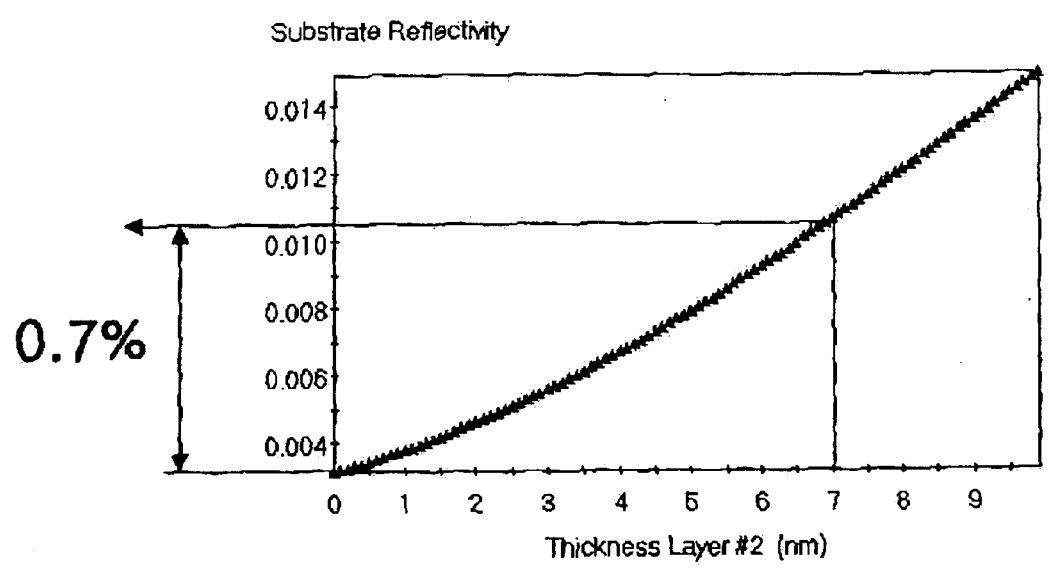
FIG. 2 is a graph illustrating the variation of the reflectivity depending on the thickness of the anti-reflective film in a disclosed method for forming photoresist patterns.

With regard to this example, variation of reflectivity depending on the thicknesses of the anti-reflective film was determined and illustrated in FIG. 2.

EXAMPLE 2

Formation of Photoresist Pattern by the Present Invention

An organic anti-reflective coating composition having a refractive index of 1.64 and light-absorbency of 0.64 at 193 nm light (manufactured by DONG-JIN SEMICHEM corp., which has the trade name of DARC-20 available for a 355 Å coating) was spin-coated on a silicon wafer, baked at 240° C. for 90 seconds to generate cross-linkage bonds and, thereby forming the intended first anti-reflective film with a 355 Å thickness. Again, onto the coated anti-reflective film, another organic anti-reflective coating composition having a refractive index of 1.49 and light-absorbency of 0.33 at 193 nm light which has the trade name DARC-21, baked at 240° C. for 90 seconds to generate cross-linkage bonds and, thereby forming the second anti-reflective film with a 1000 Å thickness. The obtained second anti-reflective film was subjected to an etching process using e-MAX etching apparatus (available from AMAT corp.). Such an etching process was performed under the conditions of 50 mT/300W/150Ar/80CF$_4$/20O$_2$/20CO/20" to produce the resultant anti-reflective film of 455 Å, which substantially represents the sum of 355 Å of the first anti-reflective film and 100 Å of the second anti-reflective film.

The processed anti-reflective film was further subjected to additional baking process at 120° C. for 90 seconds after coating the film with a photoresist manufactured by Clariant corp., which has the trade name AX1020P, widely known as the photoresist material. After the baking process, the obtained material was exposed to light by an ArF exposure apparatus manufactured by ASML and further baked at 120° C. for 90 seconds. To the exposed wafer, a developing process was performed in 2.38% by weight aqueous TMAH developer solution to obtain a 100 nm L/S pattern. As a result of determining CD at 20 points for the 100 nm pattern, the CD represented a standard deviation of 3.39 nm.

As described in the comparative example 1 and the examples 1 and 2, it was found that the micro-bends formed in the anti-reflective film by preparing a single anti-reflective film and etching the film may cause a difference in the thickness in the film, thus causing reflective light. Due to such reflective light, the resultant photoresist pattern has the possibility of reduced CD uniformity thereof.

However, according to the pattern-forming method of the present invention comprising double-coating two kinds of anti-reflective coating compositions with different refractive indices and light-absorbencies to form the anti-reflective film, it will be understood that the above problem can be sufficiently solved by reducing the reflective light to the lowest level through light interference thereby substantially eliminating CD alteration caused by the reflective light.

The above description and result will be clearly represented in the accompanying drawings. For example, as shown in FIG. 1, the anti-reflective film produced by forming only a single anti-reflective film has represented increase in the reflectivity from less than 0.5% to 2.0% at a difference in thickness of about 70 Å. On the contrary, FIG. 2 illustrates that the desired anti-reflective film produced by double-coating two kinds of films with different refractive indices and light-absorbencies has represented reduced increase in the reflectivity from less than 0.4% to 1.05% even at a difference in thickness of 70 Å. That is, it is obvious that the latter can noticeably reduce generation of reflective light due to the difference in thickness of the anti-reflective film.

As clear from the above description, the pattern-forming method of the present invention forms micro-bends in anti-reflective film by performing etching process of the anti-reflective film to inhibit collapse of photoresist pattern; and forms a desirable anti-reflective film by double-coating two kinds of anti-reflective films with different refractive indices and light-absorbencies to reduce generation of reflective light due to the difference in thickness in the resultant anti-reflective film caused by such micro-bends, so that it can prevent CD alteration of the photoresist pattern, caused by the reflective light.

It is further understood by those skilled in the art that the above description relates to preferred embodiments and that various changes and modifications may be made in the invention without departing from the spirit and scope thereof. It will also be noted that the layer thickness, process temperatures and process times listed above are approximations and that the actual values may vary without departing from the scope of this disclosure.

What is claimed is:

1. A method for forming patterns of a semiconductor device comprising:
    (a) applying a first organic anti-reflective coating composition onto a surface of a layer to be etched and conducting a baking process to form a first anti-reflective film;
    (b) applying a second organic anti-reflective coating composition on the upper portion of the first anti-reflective film with a different refractive index and light-absorbency from the first organic anti-reflective composition and conducting a further baking process to form a second anti-reflective film;
    (c) performing an etching process of the fanned anti-reflective films to form micro-bends thereon; and
    (d) coating photoresist on the anti-reflective films with micro-bends, exposing the coated anti-reflective films to light source and then developing the same to form desirable photoresist patterns.

2. The method according to claim 1, wherein the first anti-reflective coating composition has a first refractive index ranging from 1.20 to 2.00 and a first light absorbency ranging from 0.2 to 0.9 and the second coating composition having a second refractive index ranging from 1.20 to 2.00 and a second light absorbency ranging from 0.00 to 0.50, wherein the refractive index and first light absorbency are greater than the second refractive index and second light absorbency respectively.

3. The method according to claim 2, wherein the first refractive index is about 1.64 and the first light absorbency is about 0.64 for 193 nm light and the second refractive index is one of 1.49 or 1.54 and the second light absorbency is one of 0.33 or 0.38 for 193 nm light.

4. The method according to claim 1, wherein the first anti-reflective film is formed with a thickness of about 355

Å and the second anti-reflective film is formed with a thickness of about 1000 Å.

5. The method according to claim 2, wherein the first anti-reflective film is formed with a thickness of about 355 Å and the second anti-reflective film is formed with a thickness of about 1000 Å.

6. The method according to claim 1, wherein the baking process of the first or the second anti-reflective film is performed at a temperature ranging from 150 to 300° C. for a time period ranging from 1 to 5 minutes.

7. The method according to claim 1, wherein the pattern forming step further comprises an additional baking process before and/or after the exposure process.

8. The method according to claim 5, wherein the pattern forming step further comprises an additional baking process before and/or after the exposure process.

9. The method according to claim 7, wherein an additional baking process is performed after developing photoresist to form the desired patterns, the additional backing process being performed at a temperature ranging from 70 to 200° C.

10. A semiconductor device manufactured by the method of claim 1.

* * * * *

UNITED STATES PATENT AND TRADEMARK OFFICE
CERTIFICATE OF CORRECTION

PATENT NO. : 6,764,964 B2
DATED : July 20, 2004
INVENTOR(S) : Young-Sun Hwang et al.

It is certified that error appears in the above-identified patent and that said Letters Patent is hereby corrected as shown below:

<u>Title page,</u>
Item [75], Inventors, please delete "Ichon-shi" and replace with -- Icheon-shi --; and please delete "Chcol-kyu" and replace with -- Cheol-kyu --.

<u>Column 6,</u>
Line 46, please delete "fanned" and replace with -- formed --.

Signed and Sealed this

Fourteenth Day of December, 2004

JON W. DUDAS
*Director of the United States Patent and Trademark Office*